(12) United States Patent
Stachelski

(10) Patent No.: US 11,316,524 B1
(45) Date of Patent: Apr. 26, 2022

(54) PROCESS INDEPENDENT SPREAD SPECTRUM CLOCK GENERATOR UTILIZING A DISCRETE-TIME CAPACITANCE MULTIPLYING LOOP FILTER

(71) Applicant: CENTAUR TECHNOLOGY, INC., Austin, TX (US)

(72) Inventor: David Stachelski, Austin, TX (US)

(73) Assignee: CENTAUR TECHNOLOGY, INC., Austin, TX (US)

( * ) Notice: Subject to any disclaimer, the term of this patent is extended or adjusted under 35 U.S.C. 154(b) by 0 days.

(21) Appl. No.: 17/109,213

(22) Filed: Dec. 2, 2020

(51) Int. Cl.
| | |
|---|---|
| H03L 7/197 | (2006.01) |
| H03L 7/093 | (2006.01) |
| H04B 1/69 | (2011.01) |
| H03L 7/099 | (2006.01) |
| H03L 7/089 | (2006.01) |

(52) U.S. Cl.
CPC .......... H03L 7/1976 (2013.01); H03L 7/0895 (2013.01); H03L 7/093 (2013.01); H03L 7/099 (2013.01); H04B 1/69 (2013.01)

(58) Field of Classification Search
CPC ..... H03L 7/1976; H03L 7/099; H03L 7/0895; H03L 7/093; H04B 1/69
See application file for complete search history.

(56) References Cited

U.S. PATENT DOCUMENTS

| | | | | | |
|---|---|---|---|---|---|
| 4,296,392 | A | * | 10/1981 | Lee ...................... | H03H 19/004 327/337 |
| 4,987,373 | A | * | 1/1991 | Soo ...................... | H03D 13/004 327/145 |
| 5,659,269 | A | * | 8/1997 | Myers .................... | H03L 7/093 331/14 |
| 5,793,257 | A | * | 8/1998 | Inanami ............... | H03K 3/0231 331/25 |
| 2008/0084242 | A1 | * | 4/2008 | Ullmann .............. | H03H 19/004 327/554 |
| 2016/0105187 | A1 | * | 4/2016 | J .......................... | H03K 3/0315 331/36 C |
| 2018/0212611 | A1 | * | 7/2018 | Shen ..................... | H03L 7/0891 |

OTHER PUBLICATIONS

Amourah et al., "A Novel Switched-Capacitor-Filter Based Low-Area and Fast-Locking PLL" IEEE 2005 Custom Integrated Circuits Conference, Sep. 2015 (Year: 2015).*

(Continued)

*Primary Examiner* — Sam K Ahn
*Assistant Examiner* — Amneet Singh
(74) *Attorney, Agent, or Firm* — McClure, Qualey & Rodack, LLP

(57) ABSTRACT

In one embodiment, a spread spectrum clock generator, comprising a digital delta sigma modulator coupled to a fractional N, phase locked loop (PLL), the PLL comprising a discrete-time capacitance multiplier loop filter, the discrete-time capacitance multiplier loop filter comprising: an amplifier comprising a non-inverting input and an inverting input; a first switched capacitor resistor and a capacitor coupled to the non-inverting input, the capacitor coupled between the first switched capacitor resistor and the non-inverting input; and a second switched capacitor resistor coupled to the inverting input.

17 Claims, 4 Drawing Sheets

(56) References Cited

OTHER PUBLICATIONS

Park et al., "Fractional-N PLL with 90° Phase Shift Lock and Active Switched-Capacitor Loop Filter" IEEE 2005 Custom Integrated Circuits Conference, p. 329-332, Oct. 2005 (Year: 2005).*
"Fractional/Integer-N PLL Basics"; Technical Brief SWRA029; Wireless Communication Business Unit; Edited by Curtis Barrett; Aug. 1999; pp. 1-55.

* cited by examiner

PROCESS INDEPENDENT SPREAD SPECTRUM CLOCK GENERATOR UTILIZING A DISCRETE-TIME CAPACITANCE MULTIPLYING LOOP FILTER

TECHNICAL FIELD

The present invention relates in general to spread spectrum clock generators, and in particular, spread spectrum clock generators used in systems on chip (SoC).

BACKGROUND

Spread spectrum clock generators (SSCGs) are ubiquitous in modern day system on a chip (SoC) devices and microprocessors. SSCGs are needed to reduce Electromagnetic Interference (EMI), which can cause systems to interfere with one another. SSCGs are usually implemented as fractional-N, phase locked loops (PLLs) using digital delta sigma modulators (DDSMs), which require a low PLL bandwidth to filter quantization noise. The low loop bandwidth mandates bulky on-chip capacitors, which can lead to prohibitive area consumption. In addition to the capacitors, the loop filter is usually implemented with resistors. Together, the resistors and capacitors form poles and zeroes necessary to stabilize a control loop of the PLL. Since on-die resistors and capacitors do not track with process, the control loop of the PLL can degrade, leading to decreased EMI suppression and an increase in jitter.

SUMMARY

In one embodiment, a spread spectrum clock generator, comprising a digital delta sigma modulator coupled to a fractional N, phase locked loop (PLL), the PLL comprising a discrete-time capacitance multiplier loop filter.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Various aspects of the invention can be better understood with reference to the following drawings. The components in the drawings are not necessarily to scale, with emphasis instead being placed upon clearly illustrating the principles of the present invention. Moreover, in the drawings, like reference numerals designate corresponding parts throughout the several views.

DETAILED DESCRIPTION

Figure 1A:
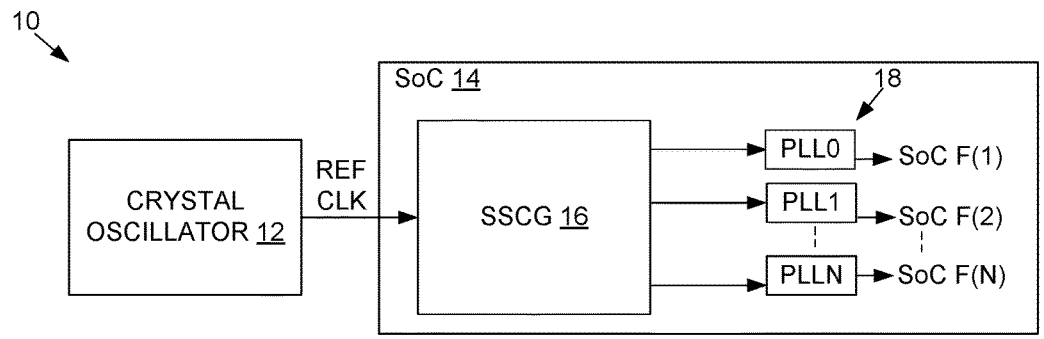
FIG. 1A is a block diagram showing an example environment in which an embodiment of a process independent spread spectrum clock generator (SSCG) may be used.

Certain embodiments of a process independent spread spectrum clock generator (SSCG) having a discrete time capacitance multiplier loop filter and associated method are disclosed that uses a combination of switched capacitor resistors for a capacitance multiplier loop filter and a calibrated voltage controlled oscillator (VCO) in combination with a scaled current reference to provide a process-independent SSCG.

Digressing briefly, SSCGs are typically implemented as fractional N, phase locked loops (PLLs) using digital delta sigma modulators. Fabrication of the SSCGs involves different processes for the resistors and capacitors, and hence one fabrication process does not track well with the other, which can result in degraded performance of the PLL. In contrast, certain embodiments of a process independent SSCG use a discrete time capacitance multiplier filter that, in combination with a switched capacitor (programmable) charge pump current reference that is dynamically selected based on a VCO gain, which keeps a PLL control loop gain constant, enables process independent operation that improves the performance of the PLL and hence SSCG performance improvements (e.g., smaller area consumption, improved EMI suppression, and/or decreased jitter).

Having summarized certain features of a process independent SSCG of the present disclosure, reference will now be made in detail to the description of a process independent SSCG as illustrated in the drawings. While a process independent SSCG will be described in connection with these drawings, there is no intent to limit it to the embodiment or embodiments disclosed herein. That is, while the invention is susceptible to various modifications and alternative forms, specific embodiments thereof are shown by way of example in the drawings and will herein be described in detail sufficient for an understanding of persons skilled in the art. It should be understood, however, that the drawings and detailed description thereto are not intended to limit the invention to the particular form disclosed. On the contrary, the intention is to cover all modifications, equivalents and alternatives falling within the spirit and scope of the present invention as defined by the appended claims. As used throughout this application, the word "may" is used in a permissive sense (i.e., meaning having the potential to), rather than the mandatory sense (i.e., meaning must). Similarly, the words "include", "including", and "includes" mean including, but not limited to.

Referring now to FIG. 1A, shown is an example environment 10 in which an embodiment of a process independent spread spectrum clock generator (SSCG) may be used. The environment includes a crystal oscillator 12 that provides a reference clock to a system on chip (SoC) 14. The SoC 14 comprises a process independent SSCG 16 that is configured to control a plurality of phase locked loops (PLLs) 18. Each of the PLLs 18 are configured to provide an output to different functional areas or logic on the SoC 14 (depicted in FIG. 1A as SoC f(x), where x equals 1, 2, . . . N). For instance, PLL0 18 may be configured to drive plural processor cores (e.g., to clock the cores) of a multi-core processor on the SoC 14 based on an output of the SSCG 16.

As another example, PLL1 18 may be configured to generate a double data rate (DDR) reference clock based on an output of the SSCG. There may be additional and/or other logic that is the recipient of the output of the PLLs 18 as would be appreciated by one having ordinary skill in the art, and hence further discussion of the same if omitted here for brevity and since it is not germane to the invention.

Figure 1B:
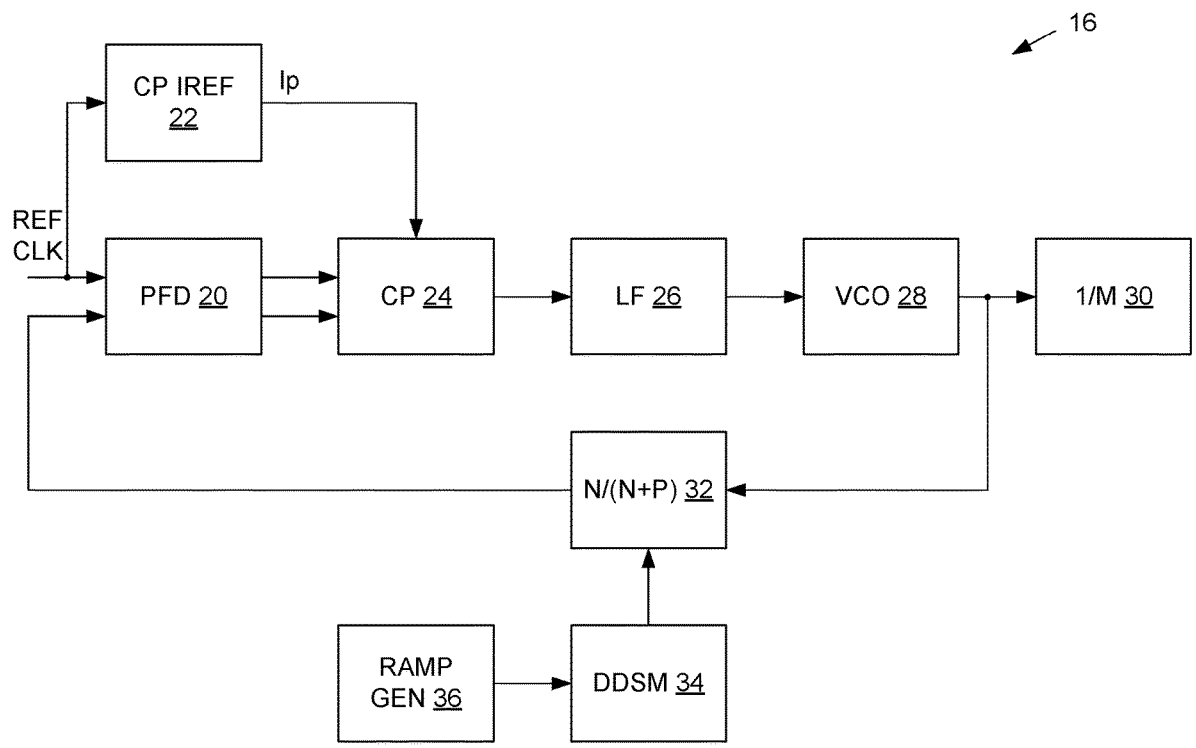
FIG. 1B is a schematic diagram showing an embodiment of an example a process independent SSCG.

FIG. 1B is a schematic diagram that shows an embodiment of an example process independent SSCG. In particular, FIG. 1B shows the SSCG 16 of FIG. 1A in more detail. As is known, frequency references, such as the crystal oscillator 12, can be a major source of electromagnetic interference (EMI) on SoCs, among other sources of EMI. Spread spectrum clock generators implement a technique where the clock frequency is modulated slightly to lower the peak energy generated by a clock. Spread spectrum clocking lowers clock-generated EMI from both the fundamental frequency and subsequent harmonics, thereby reducing the total system EMI. In other words, a spread spectrum clock generator is configured to spread the energy over a larger portion of a given frequency spectrum. As explained above, the SSCG 16 comprises a fractional N, PLL that, aside from the innovations noted herein, uses a digital delta sigma modulator (DDSM), a configuration that in general is commonly used in industry. The crystal oscillator 12 provides a reference frequency to the PLL of the SSCG 16, the PLL in turn serving the function of a frequency synthesizer that provides spread spectrum clocking to the plural PLLs 18. The SSCG 16 comprises a phase frequency detector (PFD) 20, a charge pump current reference generator 22, a charge pump (CP) 24, a discrete time capacitance loop filter 26, a voltage controlled oscillator (VCO) 28, a frequency division by 1/M 30, a multi-modulus divider (N/N+P) 32, a DDSM 34, and a ramp generator 36. The functionality of components 20, 22, 24, 28, 30, 32, 34, and 36 are well-known in the industry, and hence discussion of the same is omitted here for brevity. Additional information about SSCGs may be found in published literature, such as Texas Instruments™ Technical brief SWRA029, "Fractional/Integer-N PLL Basics". Instead, emphasis for purposes of the invention is placed on the loop filter 26 (described further below in association with FIGS. 2A-2D) and the configurable operation between the charge pump current reference generator 22 and the VCO 28 and its impact on the corresponding gain coefficient to ensure process independence (described further below in association with FIG. 3).

Figure 2A:
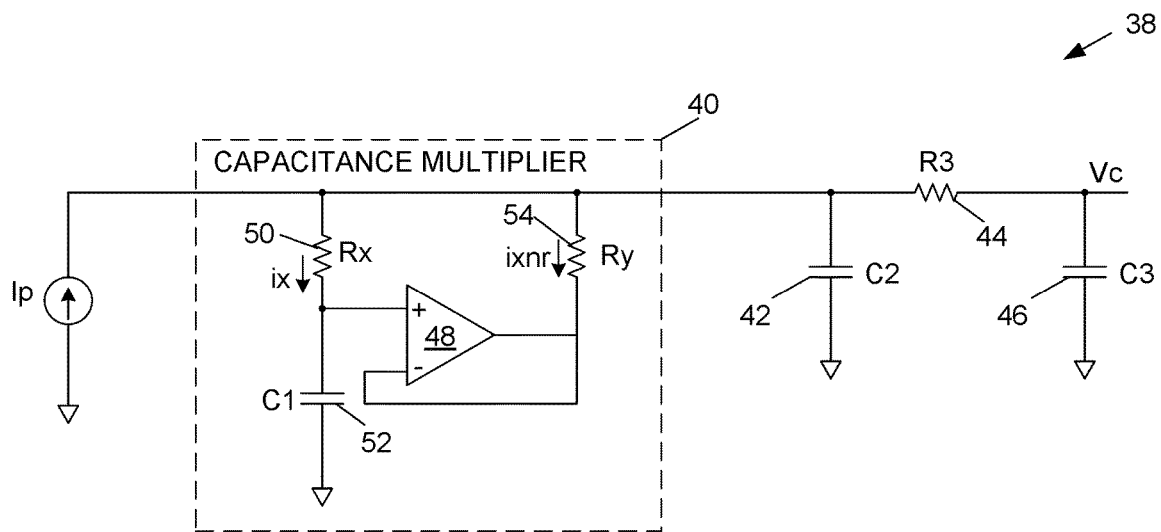
FIGS. 2A-2C are schematic diagrams showing continuous time to discrete time conversion of a capacitance multiplier loop filter of a process independent SSCG.
Figure 2B:
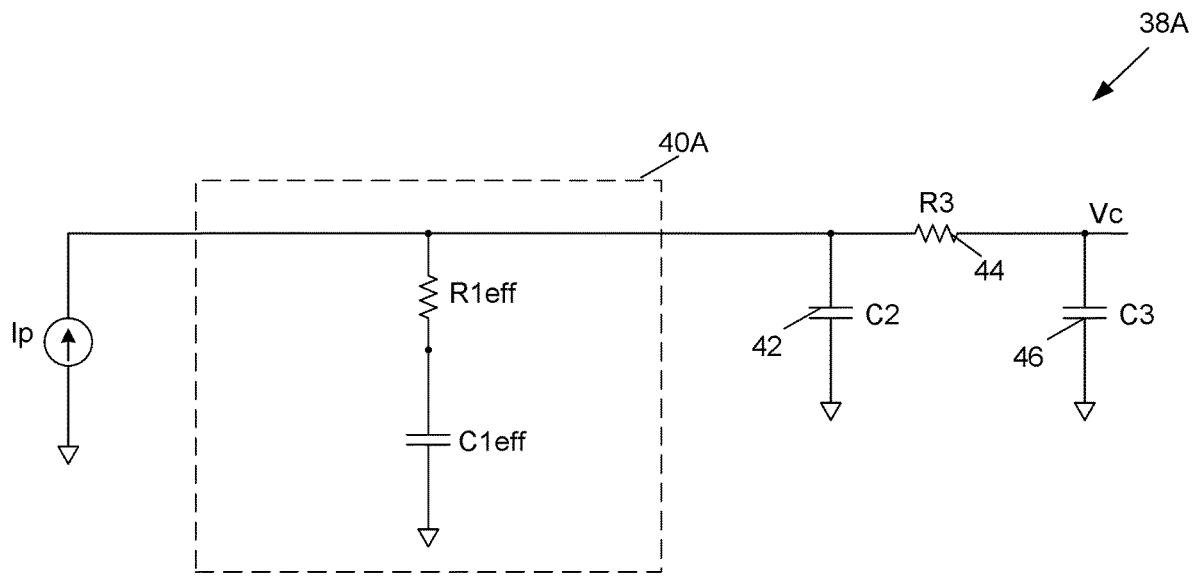
Figure 2C:
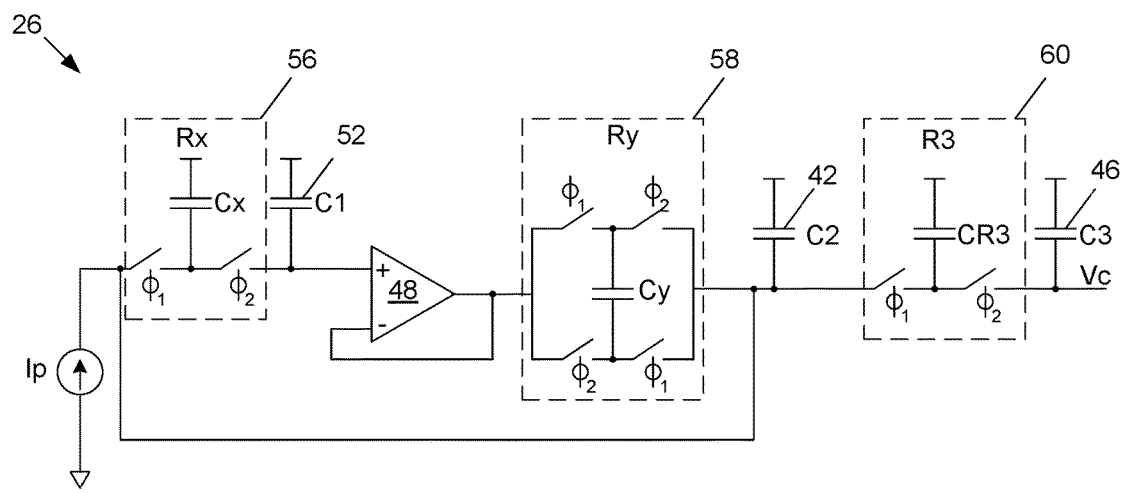

Focusing first on FIGS. 2A-2C, shown are schematic diagrams that illustrate continuous time to discrete time conversion of a capacitance multiplier loop filter. FIG. 2A in particular shows a continuous time capacitance multiplier loop filter 38 that receives a current Ip from the charge pump 24 (e.g., as generated by the charge pump current reference generator 22). The continuous time capacitance multiplier loop filter 38 comprises a continuous time capacitance multiplier 40, a capacitor C2 42, resistor R3 44, and another capacitor C3 46 in circuitry beyond the capacitance multiplier 40. The continuous time capacitance multiplier 40 comprises an amplifier 48 with an output connected to the inverting input (−), a series arrangement of a resistor Rx 50 and capacitor C1 52 at the non-inverting input (+), and another resistor Ry 54 at the output of the amplifier 48. Certain embodiments of a process independent SCCG effectively implement functionality of a continuous-time capacitance multiplying loop filter 38 using an equivalent switched capacitor loop filter, which amongst other benefits, reduces chip area. To show this implementation, the following provides an illustration of a conversion from continuous time to discrete time.

FIG. 2B illustrates a version 38A of the continuous-time capacitance multiplying loop filter 38, where the capacitance multiplier 40 is shown replaced with capacitance multiplier 40A having an effective impedance, namely, $R_{1\mathit{eff}}$ in series arrangement with $C_{1\mathit{eff}}$. The equations 1-5 below may be derived from inspection of FIGS. 2A-2B as follows:

$$R_{1\mathit{eff}} = \frac{R_x}{(1+n_r)} \quad \text{(Eqn. 1)}$$

$$C_{1\mathit{eff}} = C_1(1+n_r) \quad \text{(Eqn. 2)}$$

$$n_r = R_x/R_y \quad \text{(Eqn. 3)}$$

$$ix = I_p/(1+n_r) \quad \text{(Eqn. 4)}$$

$$R_y = R_x/n_r \quad \text{(Eqn. 5)}$$

FIG. 2C shows the discrete-time capacitance multiplier filter 26 resulting from the aforementioned conversion. In particular, the resistors Rx 50, Ry 54, and R3 44 of FIG. 2A have been replaced with switched capacitor resistors 56, 58, and 60, while the amplifier 48 and capacitors C1 52, C2 42, and C3 46 have been retained. Accordingly, the discrete-time capacitance multiplier filter 26 comprises a parallel arrangement of the switched capacitor resistor Rx 56 and capacitor C1 52 at the non-inverting input of the amplifier 48, and at the output of the amplifier 48 within the loop is the switched capacitor resistor Ry 58, with an output that feeds back to the input to the switched capacitor resistor Rx 56, which also receives charge pump current Ip. Beyond the loop, there is a parallel arrangement of the capacitor C2 42, the switched capacitor resistor R3 60, and the capacitor C3 46 at the output (Vc) of the loop filter 26.

Figure 2D:
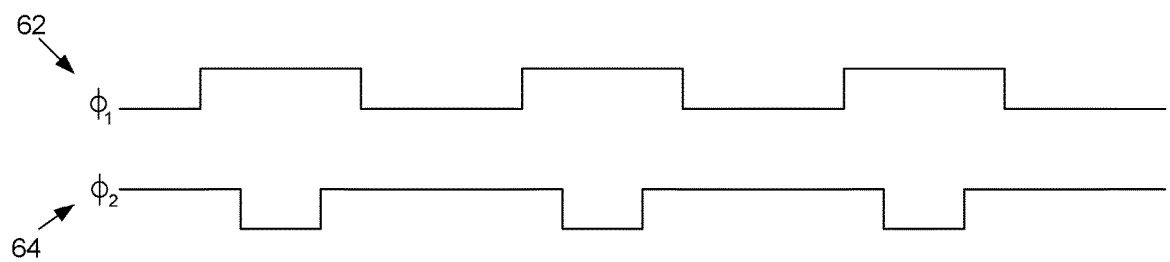
FIG. 2D is a schematic diagram showing example non-overlapping clocks used in switched capacitor resistors of a discrete time capacitance multiplier loop filter of an embodiment of a process independent SSCG.

Referring in particular to the switched capacitor resistors 56, 58, and 60, the switched capacitor resistors Rx 56 and R3 60 are similarly configured, whereas switched capacitor resistor Ry 58 comprises a bilinear switched capacitor resistor. Referring to switched capacitor resistor Rx 56, the switched capacitor resistor Rx 56 comprises at each side of a Cx branch node, comprising (in the branch) capacitor Cx, a first switch driven by a first clock, $\phi_1$, and a second switch driven by a second clock, $\phi_2$. First clock, $\phi_1$, and second clock, $\phi_2$, comprise non-overlapping clocks 62 and 64, as shown in FIG. 2D, which are generated using known clock generation techniques for switched capacitor circuits, and hence discussion of the same is omitted here for brevity. Note that switches may be implemented according to any known transistor and/or switching logic consistent with the fabrication method used for the SSCG 16. Similarly, switched capacitor resistor R3 60 comprises at each side of a CR3 branch node, comprising (in the branch) capacitor CR3, a first switch driven by a first clock, $\phi_1$, and a second switch driven by a second clock, $\phi_2$.

As indicated above, the switched capacitor resistor Ry 58 comprises a bilinear switched capacitor resistor. The switched capacitor resistor Ry 58 comprises on each side of opposing side nodes of a branch, comprising capacitor Cy, a set of switches. For instance, at the top node depicted in FIG. 2C, at each side of the node is a first switch driven by a first clock, $\phi_1$, and a second switch driven by a second clock, $\phi_2$. On the bottom node depicted in FIG. 2C, at each side of the node is a third switch driven by a second clock, $\phi_2$, and a fourth switch driven by a first clock, $\phi_1$. Explaining further, since the amplifier 48 is to drive the load, Cy, in a single set of switches, for one of the clock states (e.g., $\phi_2$), the amplifier 48 becomes unloaded, which may cause the amplifier 48 (e.g., buffer) to go unstable. By using a bilinear switched capacitor configuration, the unloading is avoided since the amplifier 48 is always exposed to the same load.

As illustrated in FIGS. 2A-2C, the continuous time capacitance multiplier filter 38 uses actual resistors Rx 50, Ry 54, and R3 44, which are converted to discrete-time via implementation as switched capacitor resistors Rx 56, Ry 58, and R3 60, respectively, as shown in FIG. 2C. Accordingly, the following equations 6-8 can be described:

$$Rx = T/Cx = 1/fCx \qquad \text{(Eqn. 6)}$$

$$Ry = T/4Cy = \tfrac{1}{4}Cy \qquad \text{(Eqn. 7)}$$

$$R3 = T/CR3 = 1/fCR3 \qquad \text{(Eqn. 8)}$$

In equations 6-8, T=the period of $\phi_1$, $\phi_2$ clocks, and f=the frequency of $\phi_1$, $\phi_2$ clocks. Notably, in the part of the continuous time capacitance multiplier loop filter 38 that performs the capacitance multiplication (e.g., continuous time capacitance multiplier 40), the effective capacitance $C_{1\mathit{eff}}$ is given by Eqn. 2, while Ry is given by Eqn. 5. Inspecting equations 2 and 5, as $n_r$ is increased to increase the effective capacitance, Ry is decreasing. Thus, a doubling of $n_r$ reduces Ry by a factor of two. Since for a standard switched capacitor resistor, Cy=T/Ry, reducing Ry by two doubles Cy. Using the bilinear switched capacitor resistor Ry 58 reduces the area penalty of increasing $n_r$ by four, as seen in equation 7 noted above. Further, since the poles and zeroes of the PLL control loop in FIG. 2C are a function of ratios of capacitors (resistors replaced by capacitors), and further since the switched capacitor resistors are a function of the reference frequency of the current reference (which depends on an off-chip crystal oscillator 12), process independence for the discrete-time multiplier loop filter 26 is achieved.

Figure 3:
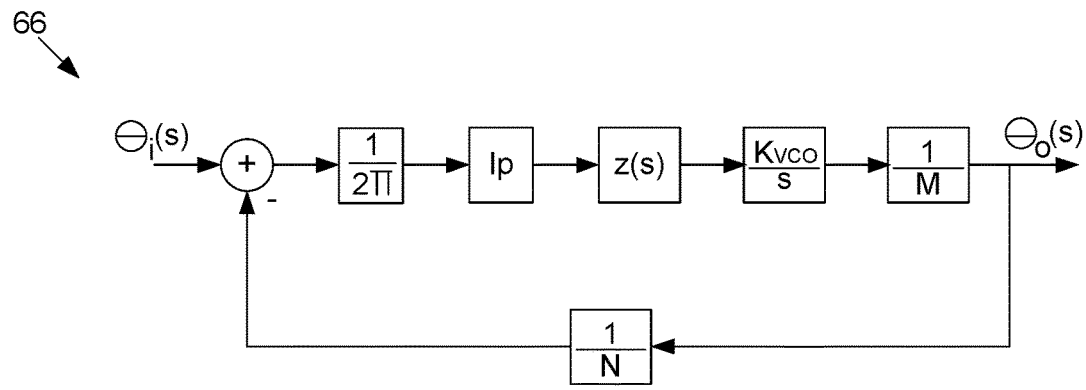
FIG. 3 is a schematic diagram showing a small signal phase domain model of a phase locked loop from which an open loop transfer function for an embodiment of a process independent SSCG is derived.

Analysis of a the SSCG transfer function is discussed below, and in particular, process independence, which may be evaluated by looking at a gain coefficient for an open loop transfer function (and similarly, closed loop given the same parameters). FIG. 3 is a schematic diagram showing a small signal phase domain model 66 of a phase-locked loop from which an open loop transfer function for an embodiment of a process independent SSCG is derived. Inspection of the small signal phase domain model 66 reveals the following equations 9-15 (with 1/N=the average divide ratio, a=1, and $R_{1e}=R_{1\mathit{eff}}$ and $C_{1e}=C_{1\mathit{eff}}$):

$$z(s) = K_{LF} \frac{(s+w_z)}{s(s+w_{p1})(s+w_{p2})} \qquad \text{(Eqn. 9)}$$

$$K_{LF} = \frac{1}{R_3 C_2 C_3} \qquad \text{(Eqn. 10)}$$

$$\omega_z = \frac{1}{R_{1e} C_{1e}} \qquad \text{(Eqn. 11)}$$

$$\omega_{p1} = \frac{b+\sqrt{b^2-4ac}}{2a} \qquad \text{(Eqn. 12)}$$

$$\omega_{p2} = \frac{b-\sqrt{b^2-4ac}}{2a} \qquad \text{(Eqn. 13)}$$

$$b = \frac{R_{1e}C_{1e}(C_2+C_3) + R_3 C_3 (C_{1e}+C_2)}{R_{1e}R_3 C_{1e}C_2 C_3} \qquad \text{(Eqn. 14)}$$

$$c = \frac{C_{1e}+C_2+C_3}{R_{1e}R_3 C_{1e} C_2 C_3} \qquad \text{(Eqn. 15)}$$

The open loop gain (or loop gain) LG(s) is given by the following equations 16-17:

$$LG(s) = \frac{1}{2\pi} \cdot I_p \cdot z(s) \cdot \frac{K_{vco}}{S} \cdot \frac{1}{M} \cdot \frac{1}{N} \qquad \text{(Eqn. 16)}$$

$$LG(s) = \frac{I_p K_{vco}}{2\pi M \overline{N}} \frac{z(s)}{s} \qquad \text{(Eqn. 17)}$$

Substituting for z(s) results in the following equation 18:

$$LG(s) = \frac{I_p K_{vco} K_{LF}}{2\pi M \overline{N}} \frac{(s+w_z)}{s^2(s+w_{p1})(s+w_{p2})} \qquad \text{(Eqn. 18)}$$

Grouping the first dividend and divisor of equation 18 into one term can be achieved, noting the following equation 19:

$$K_{LF} = \frac{1}{R_3 C_2 C_3} \qquad \text{(Eqn. 19)}$$

In particular, LG(s) may be rewritten as follows:

$$LG(s) = K \frac{(s+w_z)}{s^2(s+w_{p1})(s+w_{p2})} \qquad \text{(Eqn. 20)}$$

$$K = \frac{I_p K_{vco}}{2\pi M \overline{N} R_3 C_2 C_3} \qquad \text{(Eqn. 21)}$$

$$\omega_z = \frac{1}{R_{1e} C_{1e}} \qquad \text{(Eqn. 22)}$$

Equations for $\omega_{p1}$, $\omega_{p2}$, and b, and c are as noted in equations 12-15 (with a still equal to 1). Inspection of LG(s) shows that K, $\omega_z$, $\omega_{p1}$, $\omega_{p2}$ are functions of the absolute values of resistors, capacitors, Ip, and $K_{VCO}$ in a conventional system. So, LG(s) is not process independent. However, process independence may be achieved by implementing the resistors in the capacitance multiplier filter 38 (FIG. 2A) as switched capacitor resistors, as shown in FIG. 2C. In converting from continuous time version to discrete time versions of the filter, it is noted that R=T/C for Rx and R3, and R=T/4C for Ry as explained above. These approximations are valid as long as the bandwidth of the PLL of the SSCG 16 is much less than the reference clock frequency (e.g., BW<<Fref). Revisiting LG(s), recall equation 20, and note that LG(s) is process independent if K, $\omega_z$, $\omega_{p1}$, $\omega_{p2}$ are process independent. Through simple algebraic manipulation of the equations above, the following equation 23 can be shown:

$$\omega_z = f \frac{c_x}{c_1} \qquad \text{(Eqn. 23)}$$

In other words, ωz is a function of a stable frequency f, and the ratio of capacitors (and since fabricated from the same process, are process independent given like effects among increases or decreases of capacitance). For $\omega_{p1}$, $\omega_{p2}$, it is noted from equations 12 and 13 that if b and c are process independent (and recall a=1), $\omega_{p1}$ and $\omega_{p2}$ are process independent. Through simple algebraic manipulation of the equations described herein, the following equations 24 and 25 can be shown:

$$b = f\left(\frac{C_{R3}}{C_3} + \frac{C_{R3}}{C_2} + \frac{C_x}{C_2}(1+n_r) + \frac{C_x}{C_1}\right) \quad \text{(Eqn. 24)}$$

$$c = f^2\left(\frac{C_x C_{R3}}{C_2 C_3}(1+n_r) + \frac{C_x C_{R3}}{C_1 C_3} + \frac{C_x C_{R3}}{C_1 C_2}\right) \quad \text{(Eqn. 25)}$$

That is, b is a function of a stable reference clock frequency f, and the sum of the ratio of capacitors. $N_r$ is equal to 4Cy/Cx, and hence is a ratio of capacitors. C is also a function of a stable reference frequency, f, and the ratio of capacitors. Since a, b, and c are process independent, $\omega_{p1}$ and $\omega_{p2}$ are process independent.

Drawing attention now to gain coefficient K, and keeping in mind equation 21, Ip is generated by the switched capacitor current reference generator 22 (FIG. 1B). The equation for Ip is shown below (Eqn. 26):

$$I_p = \frac{C_I V_{ref}}{\frac{T^1}{2}} = 2f^1 C_I V_{ref}, \quad \text{(Eqn. 26)}$$

where $T^1 = 2T_{ref}$, where Tref is the reference clock period, and $f^1 = f_{ref}/2$, where fref is the reference clock frequency as explained above. Note that $C_I$ corresponds to the main capacitor used to generate the charge pump current reference. That is, the charge pump current reference comprises a switched capacitor circuit that generates Ip, and the capacitor within that block is used to generate Eqn. 26 above. Using algebraic manipulation of the above equations, equation 27 can be shown:

$$K = \frac{K_{vco}}{2\pi \, M \, \overline{N}} \frac{C_I C_{R3}}{C_2 C_3} \frac{V_{ref}}{2} \quad \text{(Eqn. 27)}$$

In other words, the product of Ip and $K_{VCO}$ is kept constant through calibration. Digressing briefly, the VCO provides a control voltage from which a clock is generated. As the control voltage is varied a frequency is varied. The VCO is composed of a programmable switching circuit or device (e.g., programmable transistor) that converts voltage to current, where the current drives a current controlled oscillator. In the calibration process, the control voltage is held constant and the transistor is switched in multiples of the current controlling the current controlled oscillator. By holding the control voltage constant, the frequency can be fine-tuned to the desired value. Further, the gain may be measured, where adjusting the control voltage leads to a gain determined by changes in frequency over the change in control voltage. Once the KVCO is determined, then the charge pump current value. In general, an objective of the calibration is to determine the gain of the VCO (KVCO) such that, once determined, the charge pump current can be changed to keep K constant (e.g., the open loop transfer function K) and hence attain process independence. Thus, the gain, $K_{VCO}$, is measured and then the Ip is scaled (note the inverse relationship between $K_{VCO}$ and Ip in Eqn. 18, and hence can be kept constant). There may be a shift in the process of Ip through CI. However, in K, the second dividend and divisor in Eqn. 27 will cause a variation to fall out resulting in K being process independent, provided Vref is process independent. Vref is derived from a bandgap voltage (which is process independent). In effect, implementing a switched capacitor, programmable charge pump current reference generator that is dynamically selected based on the VCO gain keeps the PLL control loop gain constant.

Though the above description is for the open loop path transfer function, since the closed loop function uses the same parameters, a similar derivation of process independence can be shown but is omitted here for brevity and clarity.

Figure 4:
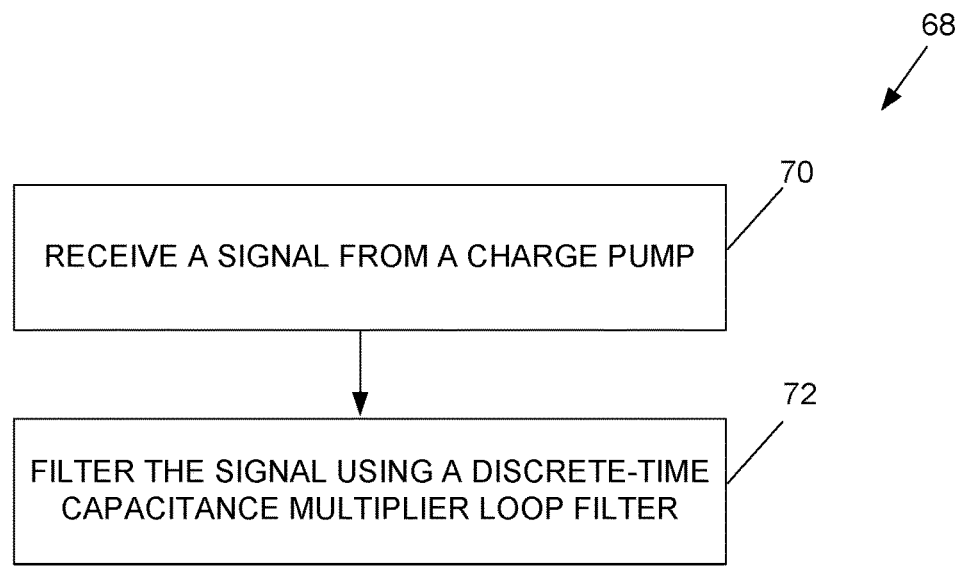
FIG. 4 is a flow diagram that shows an embodiment of an example discrete time loop filtering method.

Having described certain embodiments of a process independent SSCG, it should be appreciated that one embodiment of an example discrete time loop filtering method implemented in an SSCG, denoted in FIG. 4 as method 68, comprises receiving a signal from a charge pump (70); and filtering the signal using a discrete-time capacitance multiplier loop filter (72).

Any process descriptions or blocks in flow diagrams should be understood as representing modules, segments, logic, or portions of code which include one or more executable instructions for implementing specific logical functions or steps in the process, and alternate implementations are included within the scope of the embodiments in which functions may be executed out of order from that shown or discussed, including substantially concurrently or in different order, depending on the functionality involved, as would be understood by those reasonably skilled in the art of the present disclosure.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

Note that various combinations of the disclosed embodiments may be used, and hence reference to an embodiment or one embodiment is not meant to exclude features from that embodiment from use with features from other embodiments. In the claims, the word "comprising" does not exclude other elements or steps, and the indefinite article "a" or "an" does not exclude a plurality.

At least the following is claimed:

1. A spread spectrum clock generator, comprising a digital delta sigma modulator coupled to a fractional N, phase locked loop (PLL), the PLL comprising a discrete-time capacitance multiplier loop filter, the discrete-time capacitance multiplier loop filter comprising:
    an amplifier comprising a non-inverting input and an inverting input;
    a first switched capacitor resistor and a capacitor coupled to the non-inverting input, the capacitor coupled between the first switched capacitor resistor and the non-inverting input; and
    a second switched capacitor resistor coupled to the inverting input, the second switched capacitor resistor input coupled to an output of the amplifier and an input of the first switched capacitor resistor coupled to an output of the second switched capacitor resistor.

2. The spread spectrum clock generator of claim 1, wherein each of the first and second switched capacitor resistors comprises one capacitor and at least two switches driven by non-overlapping clocks.

3. The spread spectrum clock generator of claim 1, wherein the second switched capacitor resistor comprises a bilinear switched capacitor resistor.

4. The spread spectrum clock generator of claim 1, wherein the discrete-time capacitance multiplier loop filter is process independent.

5. The spread spectrum clock generator of claim 1, wherein the PLL further comprises a voltage controlled oscillator (VCO) configured to be calibrated and a switched capacitor, charge pump current reference generator reference, the charge pump current reference generator reference configured to be dynamically adjusted based on a gain of the VCO, wherein a resulting gain coefficient is process independent.

6. A system on chip (SoC) device, comprising:
a spread spectrum clock generator, comprising a digital delta sigma modulator coupled to a fractional N, phase locked loop (PLL), the fractional N, PLL comprising a discrete-time capacitance multiplier loop filter, the discrete-time capacitance multiplier loop filter comprising:
an amplifier comprising a non-inverting input and an inverting input;
a first switched capacitor resistor and a capacitor coupled to the non-inverting input, the capacitor coupled between the first switched capacitor resistor and the non-inverting input; and
a second switched capacitor resistor coupled to the inverting input, the second switched capacitor resistor input coupled to an output of the amplifier and an input of the first switched capacitor resistor coupled to an output of the second switched capacitor resistor; and
plural PLLs coupled to the spread spectrum clock generator, the plural PLLs each configured to serve different logic on the SoC device.

7. The SoC device of claim 6, wherein each of the first and second switched capacitor resistors comprises one capacitor and at least two switches driven by non-overlapping clocks.

8. The SoC device of claim 6, wherein the second switched capacitor resistor comprises a bilinear switched capacitor resistor.

9. The SoC device of claim 6, wherein the discrete-time capacitance multiplier loop filter is process independent.

10. The SoC device of claim 6, wherein the fractional N, PLL further comprises a voltage controlled oscillator (VCO) configured to be calibrated and a switched capacitor, charge pump current reference generator reference, the charge pump current reference generator reference configured to be dynamically adjusted based on a gain of the VCO, wherein a resulting gain coefficient is process independent.

11. The SoC device of claim 6, wherein at least one of the plural PLLs is configured to drive plural processor cores on the SoC device based on an output of the spread spectrum clock generator.

12. The SoC device of claim 6, wherein at least one of the plural PLLs is configured to generate a double data rate (DDR) reference clock based on an output of the spread spectrum clock generator.

13. A discrete-time loop filtering method implemented in a spread spectrum clock generator, the method comprising:
receiving a signal from a charge pump; and
filtering the signal using a discrete-time capacitance multiplier loop filter, the discrete-time capacitance multiplier loop filter comprising:
an amplifier comprising a non-inverting input and an inverting input;
a first switched capacitor resistor and a capacitor coupled to the non-inverting input, the capacitor coupled between the first switched capacitor resistor and the non-inverting input; and
a second switched capacitor resistor coupled to the inverting input, the second switched capacitor resistor input coupled to an output of the amplifier and an input of the first switched capacitor resistor coupled to an output of the second switched capacitor resistor.

14. The method of claim 13, wherein each of the first and second switched capacitor resistors comprises one capacitor and at least two switches driven by non-overlapping clocks.

15. The method of claim 13, wherein the second switched capacitor resistor comprises a bilinear switched capacitor resistor.

16. The method of claim 13, wherein the discrete-time capacitance multiplier loop filter is process independent.

17. The method of claim 13, further comprising calibrating a voltage controlled oscillator (VCO) and scaling a current reference to maintain a process independent gain coefficient.

* * * * *